United States Patent
Zhu et al.

(10) Patent No.: US 12,096,623 B2
(45) Date of Patent: Sep. 17, 2024

(54) VERTICAL SEMICONDUCTOR DEVICE, MANUFACTURING METHOD THEREFOR, INTEGRATED CIRCUIT AND ELECTRONIC DEVICE

(71) Applicant: Institute of Microelectronics, Chinese Academy of Sciences, Beijing (CN)

(72) Inventors: Huilong Zhu, Poughkeepsie, NY (US); Weixing Huang, Beijing (CN); Kunpeng Jia, Beijing (CN)

(73) Assignee: Institute of Microelectronics, Chinese Academy of Sciences China, Beijing (CN)

( * ) Notice: Subject to any disclaimer, the term of this patent is extended or adjusted under 35 U.S.C. 154(b) by 487 days.

(21) Appl. No.: 17/309,775

(22) PCT Filed: Apr. 9, 2019

(86) PCT No.: PCT/CN2019/081906
§ 371 (c)(1),
(2) Date: Jun. 17, 2021

(87) PCT Pub. No.: WO2020/124876
PCT Pub. Date: Jun. 25, 2020

(65) Prior Publication Data
US 2022/0085043 A1    Mar. 17, 2022

(30) Foreign Application Priority Data
Dec. 20, 2018  (CN) ......................... 201811577677.6

(51) Int. Cl.
*H10B 41/27*  (2023.01)
*H01L 29/423*  (2006.01)
*H01L 29/788*  (2006.01)

(52) U.S. Cl.
CPC ....... *H10B 41/27* (2023.02); *H01L 29/42324* (2013.01); *H01L 29/788* (2013.01)

(58) Field of Classification Search
CPC .............. H10B 41/27; H01L 29/66666; H01L 29/7827; H01L 29/42324; H01L 29/788; H01L 29/40111; H01L 29/78391
See application file for complete search history.

(56) References Cited

U.S. PATENT DOCUMENTS 9,299,835 B1  3/2016  Anderson et al.
2011/0303973 A1*  12/2011  Masuoka .......... H01L 29/66772
257/329

(Continued)

FOREIGN PATENT DOCUMENTS

CN  102456750 A  5/2012
CN  104332500 A  2/2015

(Continued)

OTHER PUBLICATIONS

International Search Report with Translation for International Application No. PCT/CN2019/081906 dated Sep. 19, 2019 in 4 pages.

*Primary Examiner* — Nduka E Ojeh
(74) *Attorney, Agent, or Firm* — Knobbe, Martens, Olson & Bear, LLP

(57) ABSTRACT

Disclosed are a semiconductor device, a method for manufacturing the same, an integrated circuit, and an electronic apparatus. The semiconductor device includes: a substrate; an active region on the substrate, the active region includes a first source and drain layer, a channel layer, and a second source and drain layer sequentially stacked on the substrate; a gate stack formed around an outer periphery of the channel layer; and an intermediate dielectric layer and a second conductive layer around an outer periphery of the gate stack and an outer periphery of the active region. The device and method provided by the present disclosure are used to solve (Continued)

the technical problem that the performances of the vertical device in the related art need to be improved. A semiconductor device with better performances is provided.

37 Claims, 14 Drawing Sheets

(56) References Cited

U.S. PATENT DOCUMENTS

| | | | |
|---|---|---|---|
| 2015/0380511 A1* | 12/2015 | Irsigler | H01L 29/78391 |
| | | | 257/295 |
| 2018/0013012 A1* | 1/2018 | Chen | H01L 21/32051 |
| 2019/0148560 A1* | 5/2019 | Cho | H01L 29/7889 |
| | | | 257/51 |
| 2020/0083329 A1* | 3/2020 | Cho | H01L 29/7827 |

FOREIGN PATENT DOCUMENTS

| | | |
|---|---|---|
| CN | 106558587 A | 4/2017 |
| CN | 107887384 A | 4/2018 |

* cited by examiner

VERTICAL SEMICONDUCTOR DEVICE, MANUFACTURING METHOD THEREFOR, INTEGRATED CIRCUIT AND ELECTRONIC DEVICE

CROSS-REFERENCE TO RELATED APPLICATION(S)

The present disclosure is a Section 371 National Stage Application of International Application No. PCT/CN2019/081906, filed on Apr. 9, 2019, which claims the priority of the Chinese patent application 201811577677.6 entitled "SEMICONDUCTOR DEVICE AND METHOD FOR MANUFACTURING THE SAME, INTEGRATED CIRCUIT AND ELECTRONIC APPARATUS" filed on Dec. 20, 2018, the content of which is incorporated here for reference.

TECHNICAL FIELD

The present disclosure relates to a field of semiconductor, and in particular to a semiconductor device, a method for manufacturing the semiconductor device, an integrated circuit, and an electronic apparatus.

BACKGROUND

A source, gate, and drain of a horizontal device are arranged in a direction substantially parallel to a surface of a substrate. Such a horizontally arranged horizontal device is not easy to further reduce its occupied area. A source, gate, and drain of a vertical device are arranged in a direction substantially perpendicular to the surface of the substrate. Therefore, compared to the horizontal device, the vertical device is easier to reduce its occupied area, which has a significant effect on increasing an integration of an integrated circuit and reducing an area occupied by a device.

Therefore, it is of great significance for the improvement of various performances of the vertical device.

SUMMARY

A purpose of the present disclosure is, at least partly, to provide a semiconductor device with improved performances, a method for manufacturing the semiconductor device, an integrated circuit including the semiconductor device, and an electronic apparatus.

In a first aspect, the embodiments of the present disclosure provides a semiconductor device, including: a substrate; an active region on the substrate, the active region includes a first source and drain layer, a channel layer, and a second source and drain layer sequentially stacked on the substrate; a gate stack formed around an outer periphery of the channel layer, the gate stack includes a gate dielectric layer and a gate conductor layer; and an intermediate dielectric layer and a second conductive layer around an outer periphery of the gate stack and an outer periphery of the active region. According to other embodiments of the present disclosure, a first conductive layer is further provided between the gate stack and the intermediate dielectric layer.

In a second aspect, the embodiments of the present disclosure provides a method for manufacturing a semiconductor device, including: forming a first source and drain layer, a channel layer, and a second source and drain layer on a substrate sequentially; defining an active region of a semiconductor device in the first source and drain layer, the channel layer, and the second source and drain layer, and forming a gate stack around an outer periphery of the channel layer, the gate stack includes a gate dielectric layer and a gate conductor layer; and forming an intermediate dielectric layer and a second conductive layer sequentially around an outer periphery of the active region and an outer periphery of the gate stack. According to other embodiments of the present disclosure, before forming the intermediate dielectric layer, the method further includes: forming a first conductive layer.

In a third aspect, an integrated circuit is provided, including the semiconductor device in the first aspect.

In a fourth aspect, an electronic apparatus is provided, including an integrated circuit formed by the semiconductor device in the first aspect.

BRIEF DESCRIPTION OF THE DRAWINGS

In order to more clearly describe the technical solutions in the embodiments of the present disclosure, the following will briefly introduce the drawings needed in the description of the embodiments. Obviously, the drawings in the following description are merely embodiments of the present disclosure. For those ordinary skilled in the art, without creative work, other drawings may be obtained based on the provided drawings, and in the drawings.

DETAILED DESCRIPTION OF EMBODIMENTS

Figure 1A:
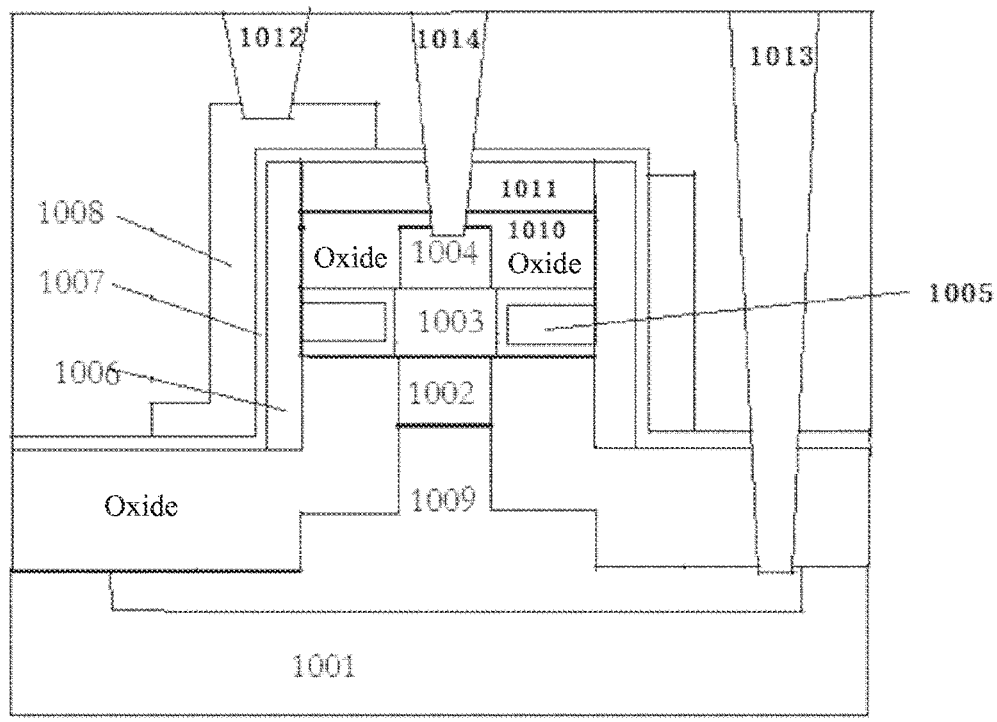
FIG. 1a shows a first structural diagram of a semiconductor device according to one or more embodiments of the present disclosure.

Hereinafter, the embodiments of the present disclosure will be described with reference to the accompanying drawings. However, it should be understood that these descriptions are only exemplary and are not intended to limit the scope of the present disclosure. In addition, in the following description, descriptions of well-known structures and technologies are omitted to avoid unnecessarily obscuring the concept of the present disclosure.

Various structural schematic diagrams in the drawings according to the embodiments of the present disclosure are shown. These drawings are not drawn to scale, some details are enlarged and some details may be omitted for clarity of presentation. Shapes of the various regions and layers, as well as the relative size and positional relationship between them which are shown in the drawings are only exemplary. In practice, there may be deviations due to manufacturing tolerances or technical limitations. Areas/layers with different shapes, sizes, and relative positions may be designed according to actual needs by those skilled in the art.

In the context of the present disclosure, when a layer/element is referred to as being "on" another layer/element, the layer/element may be directly on the another layer/element, or there may be an intermediate layer/element between them. In addition, if a layer/element is located "on" another layer/element in an orientation, the layer/element may be located "under" the another layer/element when the orientation is reversed. In the context of the present disclosure, same or similar components may be indicated by the same or similar reference numerals.

In order to better understand the above-mentioned technical solutions, the above-mentioned technical solutions will be described in detail below in conjunction with specific embodiments. It should be understood that the embodiments of the present disclosure and specific features in the embodiments are detailed descriptions of the technical solutions of the present disclosure, rather than limitations on the technical solutions of the present disclosure. The embodiments of the present disclosure and the technical features in the embodiments may be combined with each other if there is no conflict.

Figure 1B:
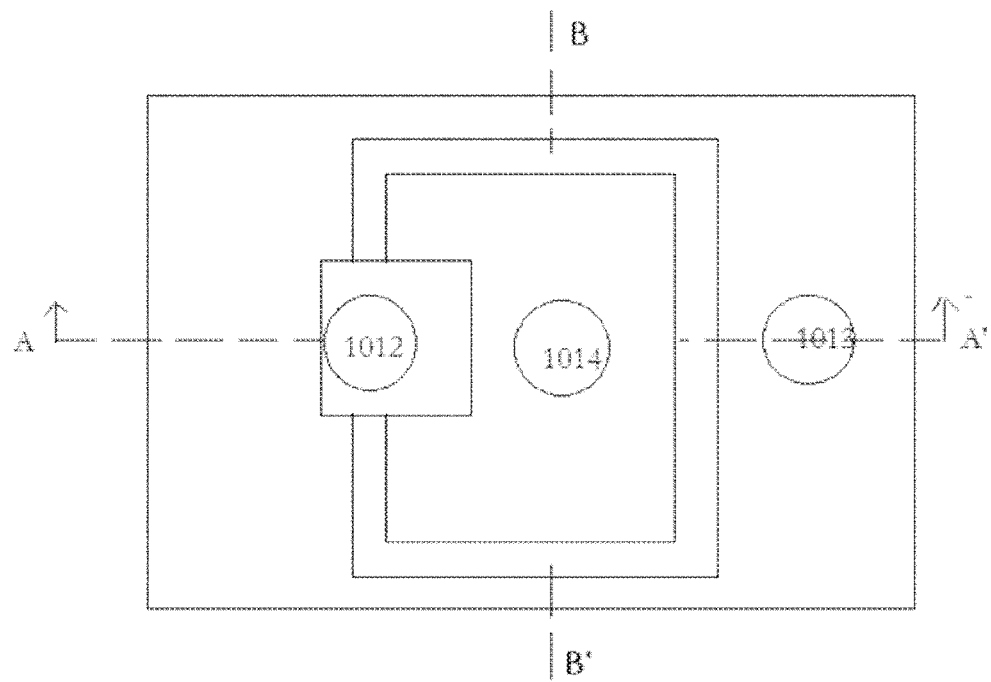
FIG. 1b shows a second structural diagram of a semiconductor device according to one or more embodiments of the present disclosure.

According to an aspect of the present disclosure, a semiconductor device is provided. As shown in FIGS. 1a and 1b, (FIG. 1a is a cross-sectional view, FIG. 1b is a corresponding top view, and FIG. 1a is a cross-sectional view taken along a line AA' in FIG. 1b), the semiconductor device includes:

a substrate 1001; an active region on the substrate, in which the active region includes a first source and drain layer 1002, a channel layer 1003, and a second source and drain layer 1004 sequentially stacked on the substrate; a gate stack 1005 formed around an outer periphery of the channel layer 1003, in which the gate stack includes a gate dielectric layer and a gate conductor layer; and an intermediate dielectric layer 1007 and a second conductive layer 1008 formed on an outer side of the gate stack.

According to another aspect of the present disclosure, a first conductive layer 1006 may further be provided between the gate stack 1005 and the intermediate dielectric layer 1007. The first conductive layer 1006 and the gate conductor layer 1005 may be in direct contact.

It should be noted that the semiconductor device is a vertical semiconductor device, specifically it may be a Metal-Oxide-Semiconductor Field-Effect Transistor (MOSEFT) or a Tunneling Field Effect Transistor (TFET), etc., these transistors may be logic devices or memory devices.

In some embodiments, the substrate 1001 may be a silicon substrate, a germanium substrate, or a III-V group compound semiconductor substrate, which is not limited here. The semiconductor device may include a contact layer 1009 formed between the first source and drain layer 1002 and the substrate 1001. A doping polarity of the contact layer 1009 is the same as a doping polarity of the first source and drain layer 1002, and the contact layer 1009 may be formed by in-situ doping epitaxy or ion post implantation annealing, with a doping concentration of about $10^{18}$-$10^{21}$/cm$^3$. Another doped well may be formed on the substrate 1001. If the substrate is silicon-on-insulator SOI, a buried oxide layer BOX of SOI may also be used to isolate the first source and drain layer and the substrate.

In some embodiments, a first source and drain layer 1002, a channel layer 1003, and a second source and drain layer 1004 are stacked on the substrate 1001. The layers may be connected to each other, or there may be other material layers, for example, a leakage suppression layer and/or an on-state current enhancement layer and other layers. Materials of the substrate 1001, the first source and drain layer 1002, the channel layer 1003, and the second source and drain layer 1004 may be the same or different, and the materials may be SiGe, Si:C, Ge or III-V group compound semiconductor materials, etc., as long as the channel layer 1003 and the first source and drain layer 1002 have etching selectivity, and the channel layer 1003 and the second source and drain layer 1004 have etching selectivity.

In some embodiments, source and drain regions of a device may be formed in the first source and drain layer 1002 and the second source and drain layer 1004, and an interval channel region may be formed in the channel layer 1003. If the semiconductor device is a P-type device, the first source and drain layer 1002 and the second source and drain layer 1004 are both P-type doped; if the semiconductor device is an N-type device, the first source and drain layer 1002 and the second source and drain layer 1004 are both N-type doped; if the semiconductor device is a tunneling field effect transistor, the first source and drain layer 1002 and the second source and drain layer 1004 are doped of opposite types. A width of a short side of the channel layer 1003 may control a short channel effect of the device, and a width of a long side of the channel layer 1003 may control a magnitude of conduction current. The gate stack 1005 may be formed around the outer periphery of the channel layer 1003, and a gate length may be determined by a thickness of the channel layer 1003 itself to be more accurate. The channel layer 1003 may be formed by epitaxial growth to well control its thickness and thus well control the gate length. The gate stack 1005 includes a gate dielectric 1005-1 and a gate electrode 1005-2 (see FIG. 12a and FIG. 12b).

Preferably, the outer periphery of the channel layer 1003 protrudes outward with respect to the outer periphery of the first source and drain layer 1002 and the outer periphery of the second source and drain layer 1004. Therefore, an overlap of the gate stack 1005 and the source and drain regions may be avoided, which helps to reduce a parasitic capacitance between the gate and the source and drain. A dielectric layer 1010 may be provided to cover side surfaces and a top of the active region, so as to isolate the active region from the first conductive layer 1006, and isolate the active region from the intermediate dielectric layer 1007. The dielectric layer 1010 may be an oxide, and a dielectric layer on the top of the active region and a dielectric layer on sidewalls of the active region may be different or not formed at the same time. The dielectric layer 1010 surrounds and covers side surfaces of the first source and drain layer 1002 and the second source and drain layer 1004, and the outer periphery of the channel layer 1003 is recessed inward with respect to an outer periphery of the dielectric layer 1010. The gate stack 1005 surrounds and covers the outer periphery of the channel layer 1003 and may be embedded in the recess of the channel layer 1003 relative to the oxide layer 1010.

In a specific implementation process, the outer periphery of the channel layer 1003 may also be recessed or flush with the outer peripheries of the first source and drain layer 1002 and the second source and drain layer 1004, which is not limited here.

In some embodiments, the semiconductor device further includes a protective layer 1011 located between the top of the active region and the intermediate dielectric layer 1007 for isolation and protection between devices. A material of the protective layer 1011 may be nitride or low-K dielectric, etc.

In some embodiments, the first conductive layer 1006 may surround the outer periphery of the side surfaces of the active region and the outer periphery of the side surfaces of the gate stack 1005. The first conductive layer 1006 is electrically connected to gate electrodes of the gate stack 1005, and the first conductive layer 1006 is isolated from the active region, specifically, isolated by the oxide layer 1010.

The intermediate dielectric layer 1007 surrounds and covers the first conductive layer, and isolates the top covering the active region, which is specifically isolated by the protective layer 1011. The second conductive layer 1008 surrounds the outer periphery of side surfaces of the intermediate dielectric layer 1007, and a height or an area of the second conductive layer 1008 is used to determine a value of a negative capacitance between the first conductive layer 1006 and the second conductive layer 1008. In some embodiments of the present disclosure, if the device structure does not include the first conductive layer, the height or area of the second conductive layer 1008 is used to determine a value of a negative capacitance between the gate conductor layer and the second conductive layer 1008. A material of the first conductive layer 1006 and the second conductive layer 1008 may be titanium nitride TiN or metal, and a material of the intermediate dielectric layer 1007 may be a ferroelectric material, a negative capacitance dielectric material, and may be an oxide containing Hf and Zr, such as $HfZrO_2$.

In the embodiments, the first conductive layer 1006 and a gate electrode layer of the gate stack 1005 form a floating gate. A dimension of the second conductive layer 1008 is used to determine a maximum value of a number of charges stored in the floating gate. In a conventional flash memory, as the floating gate is getting smaller and smaller, a number of the charges that may be stored is also decreasing, and a relative adverse effect of leakage on the number of the charges stored is also increasing. Therefore, it is necessary to increase the number of the charges stored in the floating gate, which may be achieved by increasing a dimension of the floating gate and a dimension of the second conductive layer 1008. For example, a height of the floating gate and a height of the second conductive layer 1008 are increased in a case that an area of the device is unchanged.

The first conductive layer 1006, the intermediate dielectric layer 1007, and the second conductive layer 1008 form a MIM capacitor structure. The larger an area (or the higher a height) of the second conductive layer 1008, the greater an absolute value of the capacitor. The height or area of the second conductive layer is determined according to the following condition: $Cis=Cn*Cip/(Cn+Cp)<0$ or $-|Cn|*Cip/(-|Cn|+Cip)<0$, Cn is a negative capacitance between the first conductive layer and the second conductive layer, or a negative capacitance between the gate electrode layer and the second conductive layer, Cip is a positive capacitance of the semiconductor device between an inversion layer in the channel layer and the gate stack, Cis is a capacitance after Cn and Cip are connected in series. Therefore, by adjusting the height or area of the second conductive layer 1008, the ability to store charges in the floating gate of the memory device or a sub-threshold swing of the logic device may be controlled.

When the device types are different, the materials of the corresponding intermediate dielectric layer and the dimensions of the second conductive layer 1008 are set differently. The following three are listed as examples.

In a first case, the semiconductor device is a logic device. Correspondingly, the intermediate dielectric layer 1007 includes a negative capacitance material. The height or area of the second conductive layer 1008 is determined according to the following condition: $Cs=Cis*Cc/(Cis+Cc)>=0$ or $-|Cis|*Cc/(-|Cis|+Cc)>=0$, Cc is a positive capacitance between the channel layer and the inversion layer in the channel layer, and Cs is a capacitance after Cis and Cc are connected in series. This condition may improve the sub-threshold swing of the logic device and make the sub-threshold swing steeper.

In a second case, the semiconductor device is a ferroelectric memory device.

Correspondingly, the intermediate dielectric layer 1007 includes a ferroelectric material or an insulating dielectric material. The height or area of the second conductive layer 1008 is determined according to the following condition: $Cs=Cis*Cc/(Cis+Cc)<0$ or $-|Cis|*Cc/(-|Cis|+Cc)<0$, Cc is a positive capacitance between the channel layer and the inversion layer in the channel layer, Cs is a capacitance after Cis and Cc are connected in series. This condition may improve the ability of the storage device to store charges in the floating gate.

In a third case, the semiconductor device is a flash memory, and the intermediate dielectric layer includes an insulating dielectric material, such as silicon nitride, with a thickness of 2 to 15 nanometers. The height or area of the second conductive layer is determined according to the reliability, durability and data retention time of the device.

The above-mentioned three cases assume that a height and an area of the first conductive layer are large enough to provide a sufficient area range to allow the height or area of the second conductive layer to be adjusted, which may be realized by increasing the height and area of the first conductive layer according to an effective structure forming the capacitance. For example, the first gate stack 1005 may extend to outer sidewalls of the dielectric layer 1010, so that an area directly facing the gate stack 1005 and the second conductive layer may increase.

Preferably, the second conductive layer 1008 may be provided to further include a contact portion 1008-1, and the contact portion 1008-1 extends from the outer periphery of the side surfaces of the intermediate dielectric layer 1007 to the top of the intermediate dielectric layer 1007, so as to facilitate sufficient electrical connection with a gate contact portion.

In some embodiments, the outer peripheries of the second conductive layer 1008 and the intermediate dielectric layer 1007 may be filled with oxides to cover the second conductive layer 1008 and the intermediate dielectric layer 1007. A gate contact portion 1012 electrically connected to the second conductive layer 1008, a first source and drain contact portion 1013 electrically connected to the first source and drain layer 1002, and a second source and drain contact portion 1014 electrically connected to the second source and drain layer 1004 are provided. Each contact portion may be made of metal or other conductive materials. The first source and drain contact portion 1013 may be directly connected to the contact layer 1009 as shown in FIG. 1*a* to realize the electrical connection with the first source and drain layer 1002, or the first source and drain contact portion 1013 may be directly connected with the first source and drain layer 1002. Other contact portions and areas needed to be electrically connected thereto may also be directly connected or connected through other conductors, which is not limited here.

Figure 2:
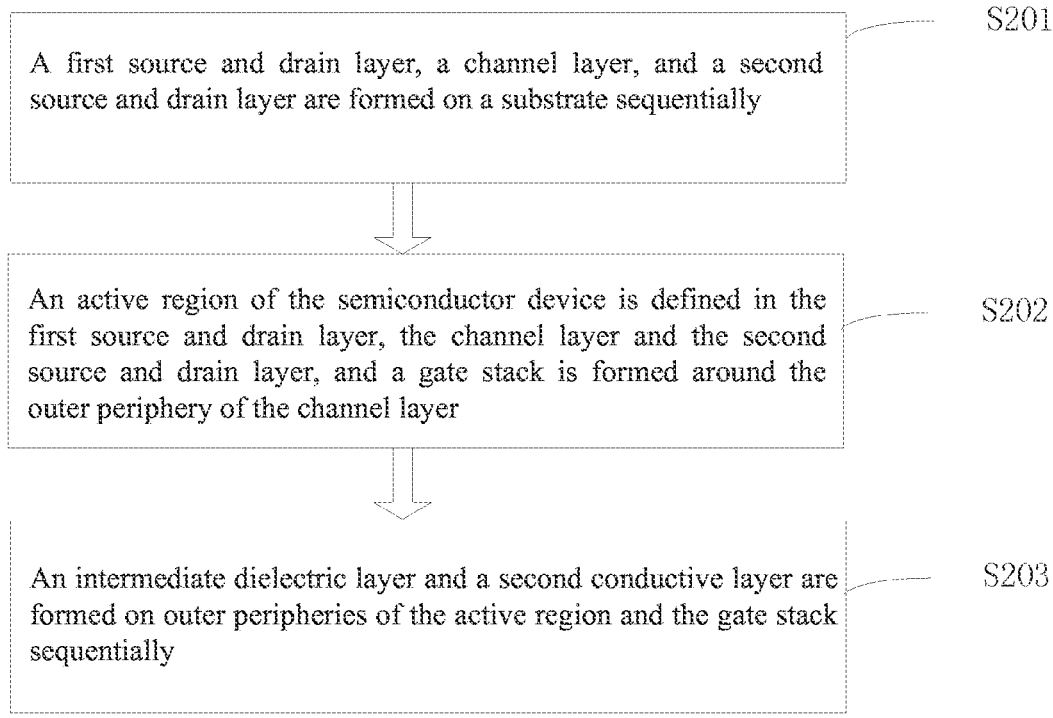
FIG. 2 shows a flowchart of a method for manufacturing a semiconductor device according to one or more embodiments of the present disclosure.

In another aspect, the present disclosure provides a method for manufacturing a semiconductor device. As shown in FIG. 2, the method includes the following steps.

In step S201, a first source and drain layer, a channel layer, and a second source and drain layer are formed on a substrate sequentially.

In step S202, an active region of a semiconductor device is defined in the first source and drain layer, the channel layer and the second source and drain layer, and a gate stack is formed around an outer periphery of the channel layer.

In step S203, an intermediate dielectric layer and a second conductive layer are formed on outer peripheries of the active region and the gate stack sequentially.

A dimension of the second conductive layer is determined according to a negative capacitance of the semiconductor device.

According to the embodiments of the present disclosure, the first conductive layer may not be formed, but an intermediate dielectric layer may be directly formed on the outer periphery of the gate stack.

It should be noted that the semiconductor device is a vertical semiconductor device, and specifically, it may be a metal oxide semiconductor field effect transistor or a tunneling field effect transistor, etc.

FIGS. 3 to 14*c* are schematic diagrams of a manufacturing process of a semiconductor device. In the following, the detailed implementation steps in the method for manufacturing the semiconductor device of this embodiment will be described in detail with reference to FIGS. 3 to 14*c*.

Before step S201 is performed, a substrate 1001 is prepared, and the substrate 1001 may be a substrate of various forms, including but not limited to, an SOI substrate, and it may also be a single silicon substrate, a germanium substrate, or a III-V group compound semiconductor substrate, etc. In the following description, for convenience of description, a bulk Si substrate is taken as an example for description.

Figure 3:
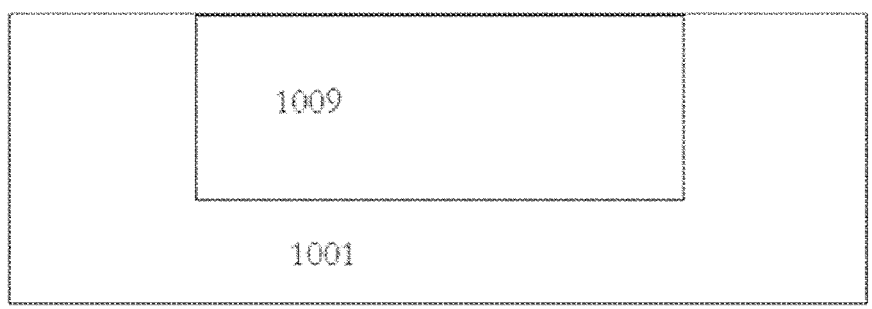
FIG. 3 shows a first process flowchart of a semiconductor device according to one or more embodiments of the present disclosure.

In a case that the substrate 1001 is an SOI substrate, a buried oxide layer BOX of SOI may be used as an isolation layer for isolation between devices. In a case that the substrate 1001 is a semiconductor substrate, such as a silicon substrate, as shown in FIG. 3, a contact layer 1009 may be formed on the substrate 1001, and a doping polarity of the contact layer 1009 is the same as that of the first source and drain layer 1002, which may be formed by in-situ doping epitaxy or ion post implantation annealing, and a doping concentration is about $10^{18}$-$10^{21}$/cm$^3$. Optionally, a doped well may also be formed on the substrate to isolate adjacent devices.

Then, the step S201 is performed to sequentially form a first source and drain layer 1002, a channel layer 1003, and a second source and drain layer 1004 on the substrate 1001.

Figure 4:
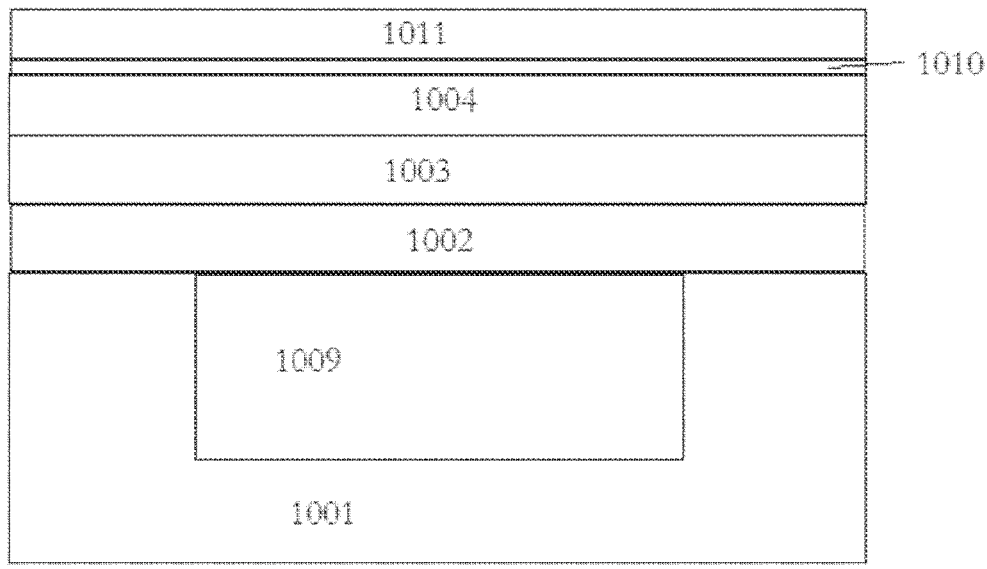
FIG. 4 shows a second process flowchart of a semiconductor device according to one or more embodiments of the present disclosure.

As shown in FIG. 4, a first source and drain layer 1002, a channel layer 1003, and a second source and drain layer 1004 may be sequentially formed on a substrate 1001 by, for example, epitaxial growth and ion doping.

For example, the first source and drain layer 1002 may include Si material with a thickness of 10 nm to 50 nm. If the semiconductor device is a P-type device, the first source and drain layer 1002 is P-type doped. Specifically, B or In ion may be implanted, and a doping concentration is $(1*10^{18}$-$2*10^{20})$/cm$^3$. If the semiconductor device is an N-type device, the first source and drain layer 1002 is N-type doped. Specifically, As or P ion may be implanted, and a doping concentration is $(1*10^{18}$-$2*10^{21})$/cm$^3$.

The channel layer 1003 may include SiGe material (for example, an atomic percentage of Ge may be about 10 to 40%) with a thickness is 10 nm to 100 nm, and the thickness defines a channel length parameter of the device. The channel layer 1003 may be doped or not.

The second source and drain layer 1004 may include a Si material with a thickness of 10 nm to 50 nm. If the semiconductor device is a P-type device, the first source and drain layer 1002 is P-type doped. Specifically, B or In ion may be implanted, and a doping concentration is $(1*10^{18}$-$2*10^{20})$/cm$^3$. If the semiconductor device is an N-type device, the first source and drain layer 1002 is N-type doped.

Specifically, As or P ion may be implanted, and a doping concentration is $(1*10^{18}-2*10^{21})/cm^3$.

The first source and drain layer 1002, the channel layer 1003, and the second source and drain layer 1004 in this embodiment are not limited to the aforementioned materials and doping manners. For example, the channel layer 1003 may include, but is not limited to, Si:C, Ge, or III-V group compound semiconductors. The channel layer 1003 may even include a semiconductor material with same constituent components as those of the first source and drain layer 1002 and the second source and drain layer 1004, but with different component contents (for example, each of the first source and drain layer 1002, the channel layer 1003 and the second source and drain layer 1004 includes a SiGe material, and Ge atomic percentages of them are different), as long as the channel layer 1003 has etching selectivity relative to the first source and drain layer 1002 underneath and the second source and drain layer 1004 above it. It should also be noted that, doping of the first source and drain layer 1002 and the second source and drain layer 1004 may be performed in this step, or may be performed after the active region is subsequently formed, which is not limited here.

As shown in FIG. 4, according to the embodiments of the present disclosure, after the first source and drain layer 1002, the channel layer 1003, and the second source and drain layer 1004 are sequentially formed on the substrate, the method further includes: a dielectric layer 1010 and a protective layer 1011 are provided on the second source and drain layer 1004.

For example, the dielectric layer 1010 includes a thermal oxide with a thickness of 2 nm to 5 nm, and is used for protection and etching stop. The protective layer 1011 includes nitride or low-K dielectric, etc., with a thickness of 10 nm to 100 nm, and is used for device isolation and protection. It is not limited to the above-mentioned materials and thicknesses, and will not be listed here.

Next, the step S202 is performed to define an active region of the semiconductor device in the first source and drain layer 1002, the channel layer 1003, and the second source and drain layer 1004, and form a gate stack 1005 around the outer periphery of the channel layer 1003.

According to the embodiments of the present disclosure, how to define the active region is described in detail below.

Figure 5A:
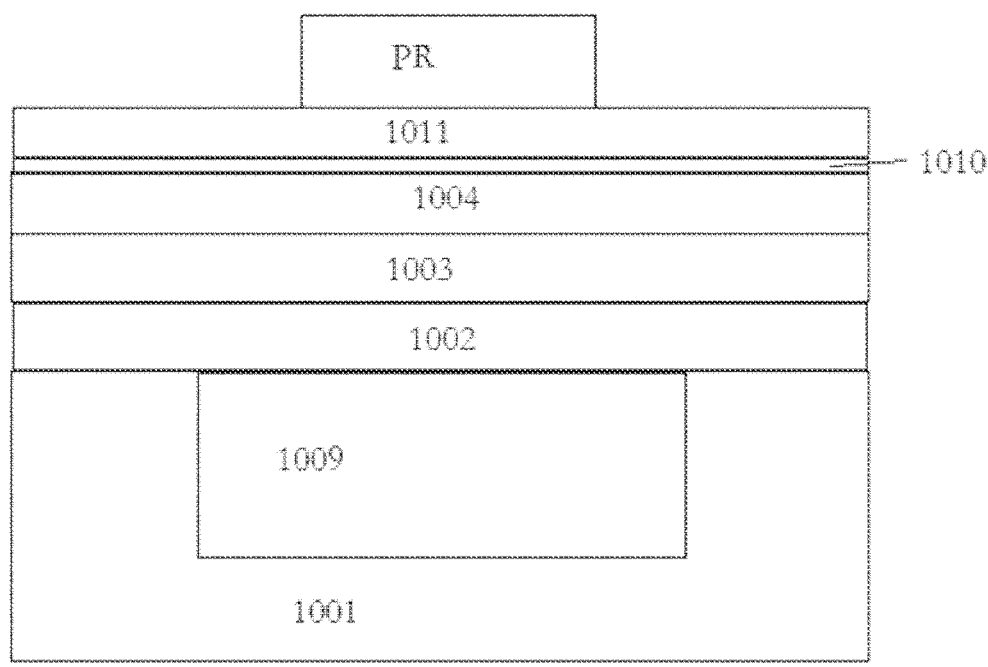
FIG. 5a shows a third process flowchart of a semiconductor device according to one or more embodiments of the present disclosure.
Figure 5B:
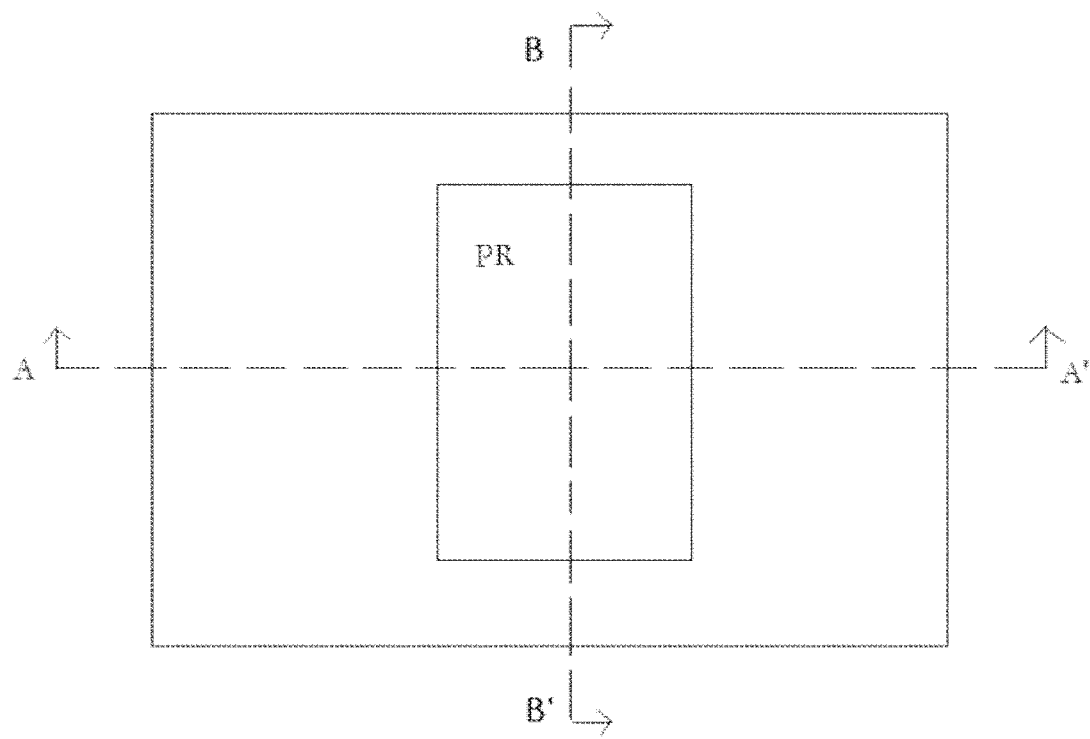
FIG. 5b shows a fourth process flowchart of a semiconductor device according to one or more embodiments of the present disclosure.

For example, as shown in FIGS. 5a and 5b (FIG. 5a is a cross-sectional view, FIG. 5b is a corresponding top view, and FIG. 5a is a cross-sectional view taken along a line AA' in FIG. 5b). A photoresist PR is formed on a stack of the first source and drain layer 1002, the channel layer 1003, and the second source and drain layer 1004 shown in FIG. 4. Then, the photoresist is patterned into a desired shape through photolithography (exposure and development). In the specific implementation process, the photoresist may be patterned as a rectangle (corresponded prepared active region is in a rectangular columnar shape) as shown in FIG. 5b, or the photoresist may be patterned as a circle (corresponded prepared active region is in a cylindrical shape), etc., which is not limited here.

It should be noted that in the following process flowchart, the cross-sectional view along the AA' direction indicates a cross-sectional view along the AA' direction in the top view as shown in FIG. 5b, and the cross-sectional view along the BB' direction indicates a cross-sectional view along the BB' direction in the top view as shown in FIG. 5b. No other explanations will be given later.

Figure 6:
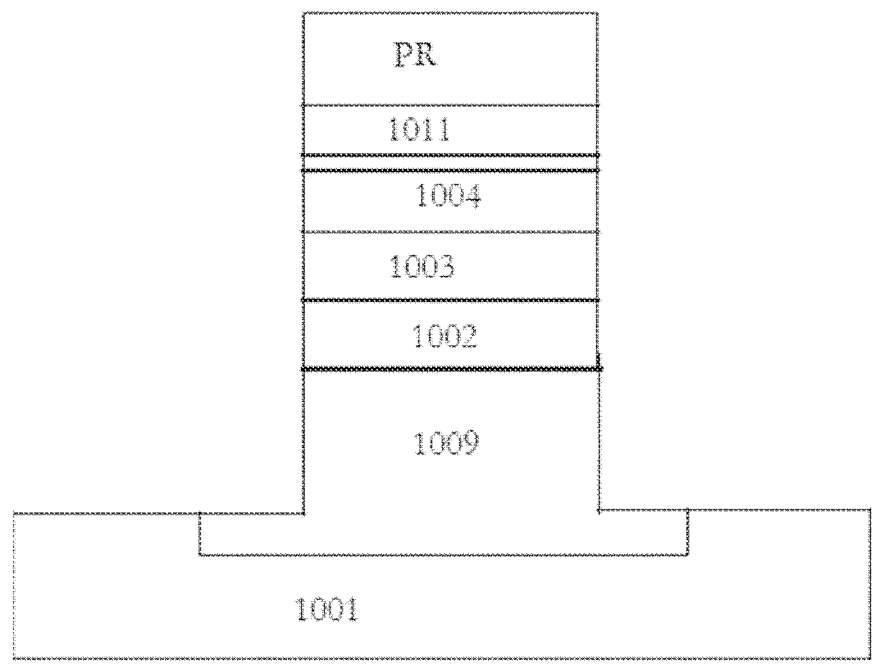
FIG. 6 shows a fifth process flowchart of a semiconductor device according to one or more embodiments of the present disclosure.

Then, as shown in FIG. 6, the patterned photoresist is used as a mask, the second source and drain layer 1004, the channel layer 1003, and the first source and drain layer 1002 are selectively etched sequentially by using, for example, reactive ion etching RIE. The etching proceeds into the substrate 1001, but does not reach a bottom surface of the substrate 1001. If the contact layer 1009 is provided, the etching proceeds into the contact layer 1009. If the oxide layer 1010 and the protective layer 1011 are provided, the oxide layer 1010 and the protective layer 1011 are etched first. A columnar stack of the second source and drain layer 1004, the channel layer 1003, and the first source and drain layer 1002 is formed on the substrate by etching. For example, RIE may be performed in a direction substantially perpendicular to a surface of the substrate, so that the columnar stack is also substantially perpendicular to the surface of the substrate. After that, the photoresist is removed.

Figure 7A:
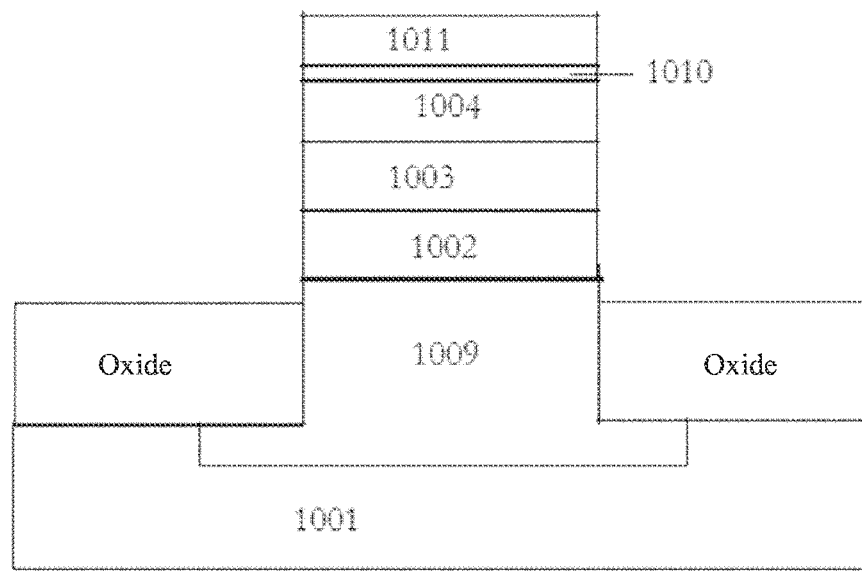
FIG. 7a shows a sixth process flowchart of a semiconductor device according to one or more embodiments of the present disclosure.
Figure 7B:
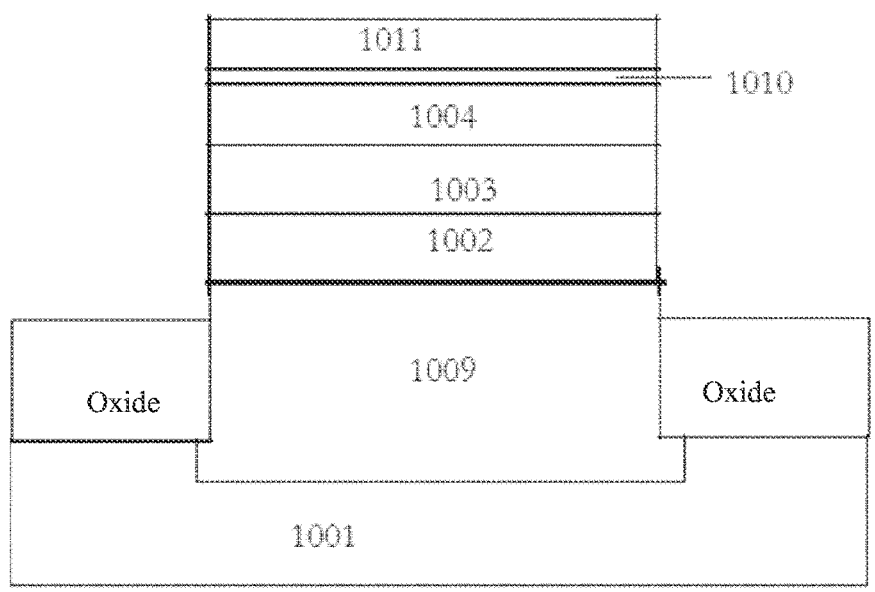
FIG. 7b shows a seventh process flowchart of a semiconductor device according to one or more embodiments of the present disclosure.
Figure 7C:
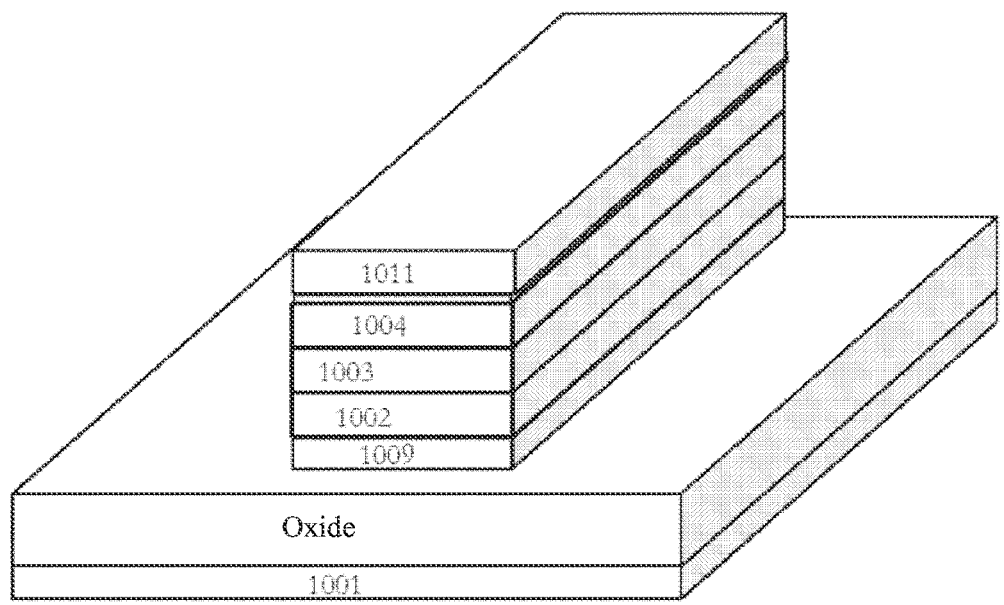
FIG. 7c shows an eighth process flowchart of a semiconductor device according to one or more embodiments of the present disclosure.

In some embodiments, as shown in FIG. 7a, FIG. 7b and FIG. 7c (FIG. 7a is a cross-sectional view along the AA' direction, FIG. 7b is a cross-sectional view along the BB' direction, and FIG. 7c is a corresponding perspective view) as well, an oxide is deposited on the substrate below a lower surface of the first source and drain layer 1002 for protection and etching stop. The oxide and the oxide layer 1010 may be the same material or different materials, which is not limited here.

Then, a sacrificial gate, the first source and drain layer 1002, and the second source and drain layer 1004 are formed. Etching may be performed so that the outer periphery of the channel layer 1003 is recessed inwardly with respect to the outer periphery of the first source and drain layer 1002 and the outer periphery of the second source and drain layer 1004. The specific steps are as follows.

Figure 8A:
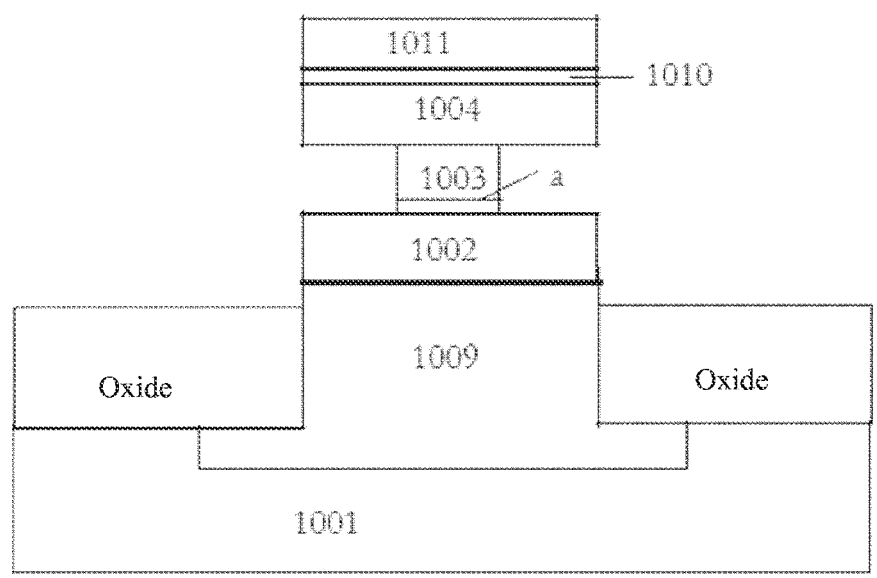
FIG. 8a shows a ninth process flowchart of a semiconductor device according to one or more embodiments of the present disclosure.
Figure 8B:
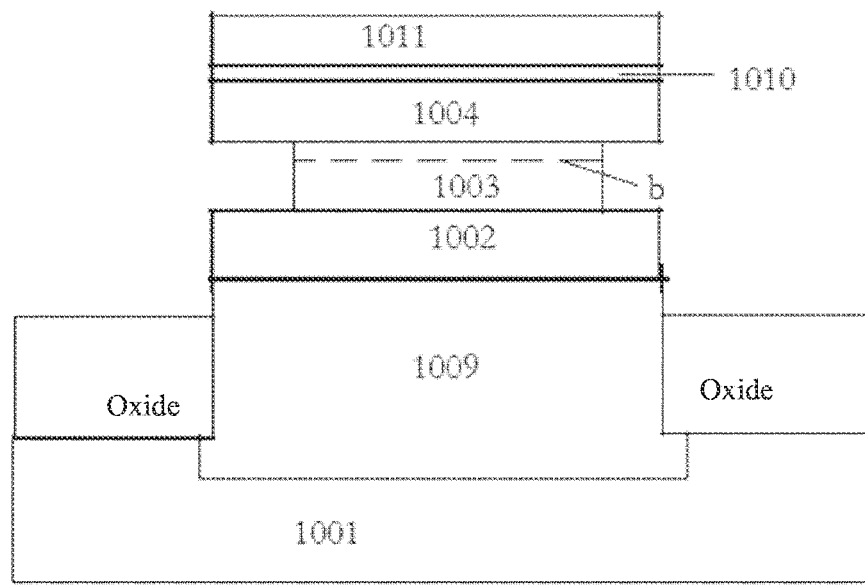
FIG. 8b shows a tenth process flowchart of a semiconductor device according to one or more embodiments of the present disclosure.
Figure 8C:
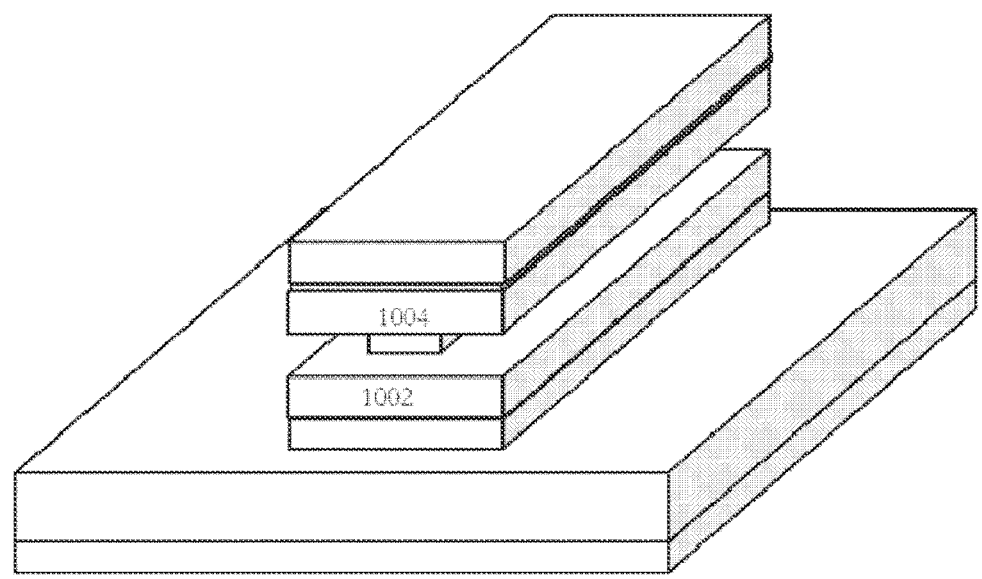
FIG. 8c shows an eleventh process flowchart of a semiconductor device according to one or more embodiments of the present disclosure.

In step S202-1, as shown in FIG. 8a, FIG. 8b and FIG. 8c (FIG. 8a is a cross-sectional view along the AA' direction, FIG. 8b is a cross-sectional view along the BB' direction, and FIG. 8c is a corresponding perspective view), the channel layer 1003 is selectively etched first according to requirements for performance parameters of the semiconductor device, so that the outer periphery of the channel layer 1003 is recessed inwardly (in this example, it is recessed in a lateral direction substantially parallel to the surface of the substrate) relative to the outer periphery of the first source and drain layer 1002 and the outer periphery of the second source and drain layer 1004. For example, the above recessing may be achieved by further selectively etching the channel layer 1003 with respect to the first source and drain layer 1002 and the second source and drain layer 1004. Specifically, techniques such as atomic layer etching ALE or digital etching may be selected for selective etching to obtain better etching accuracy control.

For example, surfaces of the first source and drain layer 1002, the channel layer 1003, and the second source and drain layer 1004 may be oxidized by heat treatment first, and then respective surface oxide layers are removed. In a case that the channel layer 1003 includes SiGe, and the first source and drain layer 1002 and the second source and drain layer 1004 include Si, an oxidation rate of SiGe is higher than that of Si, and the oxide on SiGe is easier to remove. By repeating the steps of oxidation-removal of oxides, the required recessing may be achieved. Compared with conventional selective etching, this method may better control the degree of recessing.

In some embodiments, a width a of a short side of the channel layer 1003 recessed after etching is associated with parameters of a short channel effect of the device to be controlled, and a width b of a long side of the channel layer 1003 is associated with a magnitude of a conduction current of the device to be provided. Both the width of the short side and the width of the long side are widths perpendicular to a thickness direction of the channel layer 1003.

Figure 9A:
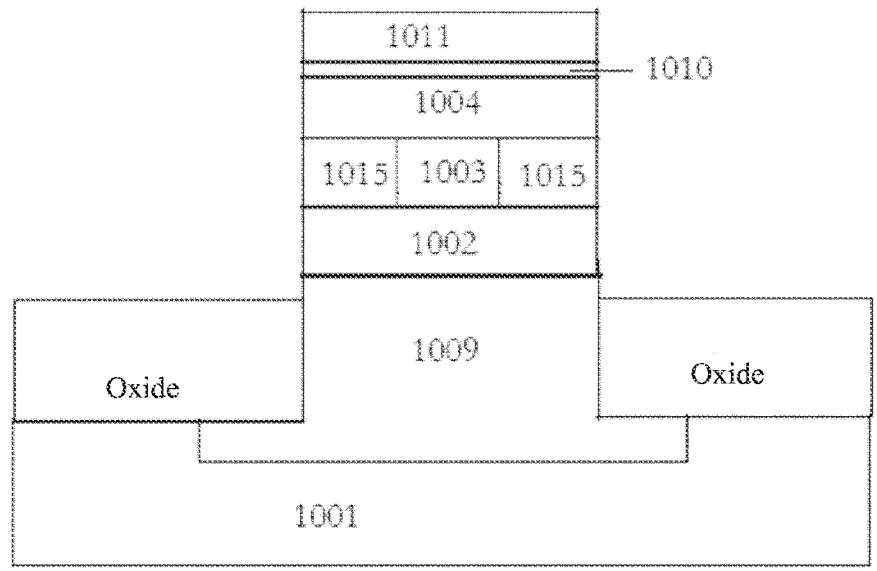
FIG. 9a shows a twelfth process flowchart of a semiconductor device according to one or more embodiments of the present disclosure.
Figure 9B:
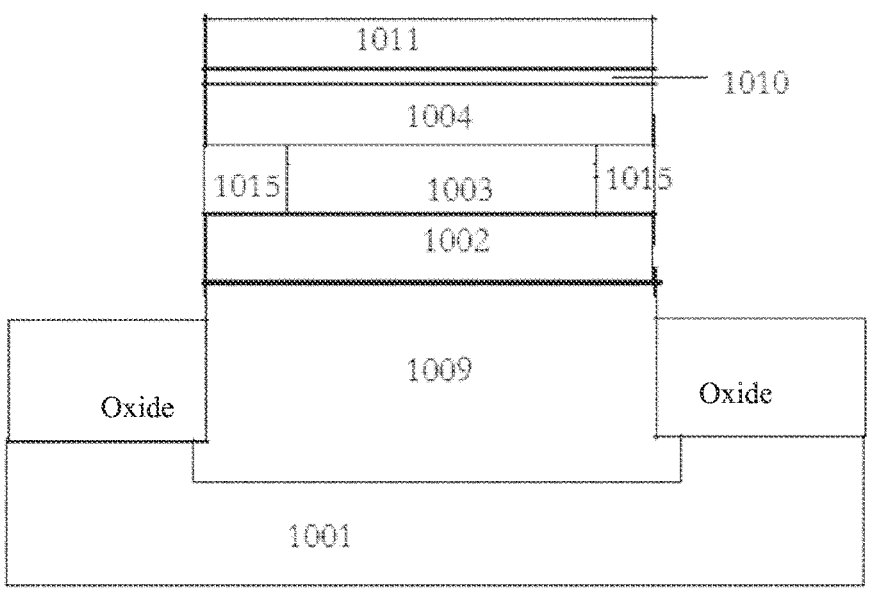
FIG. 9b shows a thirteenth process flowchart of a semiconductor device according to one or more embodiments of the present disclosure.

As shown in FIG. 9a and FIG. 9b (FIG. 9a is a cross-sectional view along the AA' direction, and FIG. 9b is a cross-sectional view along the BB' direction), step S202-2 may further be provided. Considering that the gate stack 1005 is subsequently formed in the recess of the channel layer 1003 relative to the outer periphery of the first source and drain layer 1002 and the outer periphery of the second source and drain layer 1004, in order to avoid subsequent process steps from affecting the channel layer 1003 or leaving unnecessary materials in the recess to affect the formation of the subsequent gate stack 1005, the recess of the channel layer 1003 relative to the outer periphery of the first source and drain layer 1002 and the outer periphery of the second source and drain layer 1004 may be filled with a material first to occupy a space of the gate stack 1005 to be prepared subsequently. A sacrificial gate 1015 (false gate) is formed in the space. A material of the sacrificial gate 1015 includes but is not limited to silicon oxynitride, silicon carbide or nitride. If a protective layer 1011 of nitride exists, the material of the sacrificial gate 1015 does not include nitride to have etching selectivity relative to the protective layer 1011.

For example, silicon carbide may be deposited on the structure shown in FIG. 8a, and then the deposited silicon carbide may be etched back such as RIE. The RIE may be performed in a direction substantially perpendicular to the surface of the substrate, and the silicon carbide may only retain the recessed part. As shown in FIG. 9a, the sacrificial gate 1015 may substantially fill the recess.

Figure 10A:
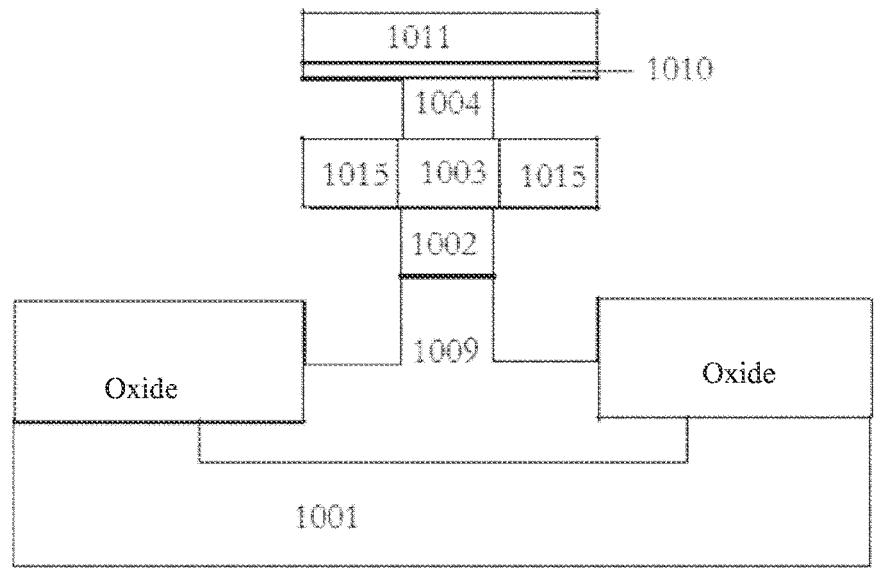
FIG. 10a shows a fourteenth process flowchart of a semiconductor device according to one or more embodiments of the present disclosure.
Figure 10B:
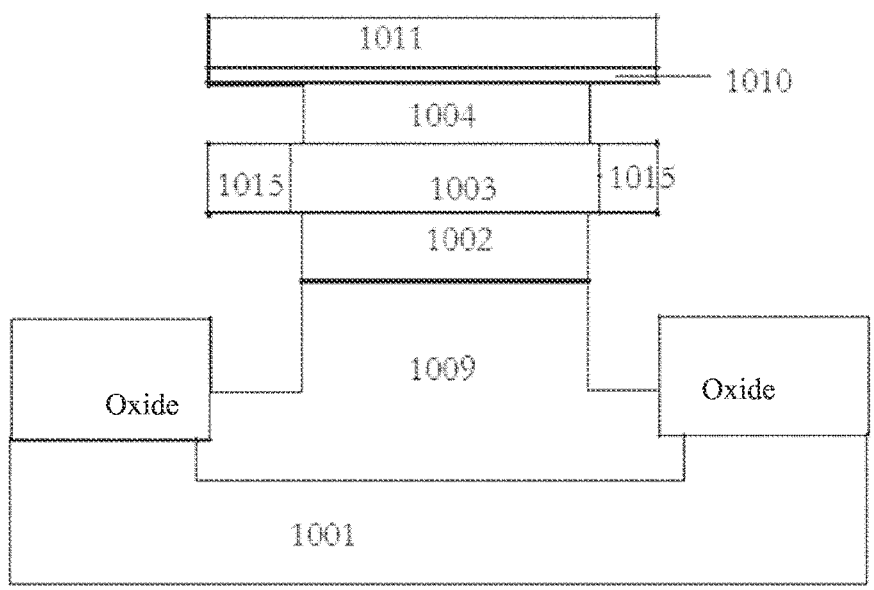
FIG. 10b shows a fifteenth process flowchart of a semiconductor device according to one or more embodiments of the present disclosure.

Next, step S202-3 is performed, as shown in FIG. 10a and FIG. 10b (FIG. 10a is a cross-sectional view along the AA' direction, and FIG. 10b is a cross-sectional view along the BB' direction), the first source and drain layer 1002 and the second source and drain layer 1004 are selectively etched to be narrower than the channel layer 1003 so that the outer periphery of the channel layer 1003 protrudes outwardly relative to the outer periphery of the first source and drain layer 1002 and the outer periphery of the second source and drain layer 1004. Specifically, techniques such as atomic layer etching ALE or digital etching may be selected for selective etching to obtain better etching accuracy control.

For example, in a case that the channel layer 1003 includes SiGe, and the first source and drain layer 1002 and the second source and drain layer 1004 include Si, SiGe is used as a barrier, and Si is etched to make the outer periphery of the channel layer 1003 protrudes outwardly relative to the outer periphery of the first source and drain layer 1002 and the outer periphery of the second source and drain layer 1004 to avoid damage to the channel layer 1003 during the etching process.

Specifically, the outer periphery of the channel layer 1003 protrudes outwardly relative to the outer periphery of the first source and drain layer 1002 and the second source and drain layer 1004, which may well avoid an overlap of the gate stack 1005 with the source and drain regions, and help to reduce a parasitic capacitance between the gate and the source and drain.

Through the above-mentioned steps S202-1 to S202-3, the formation of the sacrificial gate 1015, the first source and drain layer 1002 and the second source and drain layer 1004 is realized. Next, process steps of forming a gate stack 1005 around the outer periphery of the channel layer 1003 are introduced.

Figure 11A:
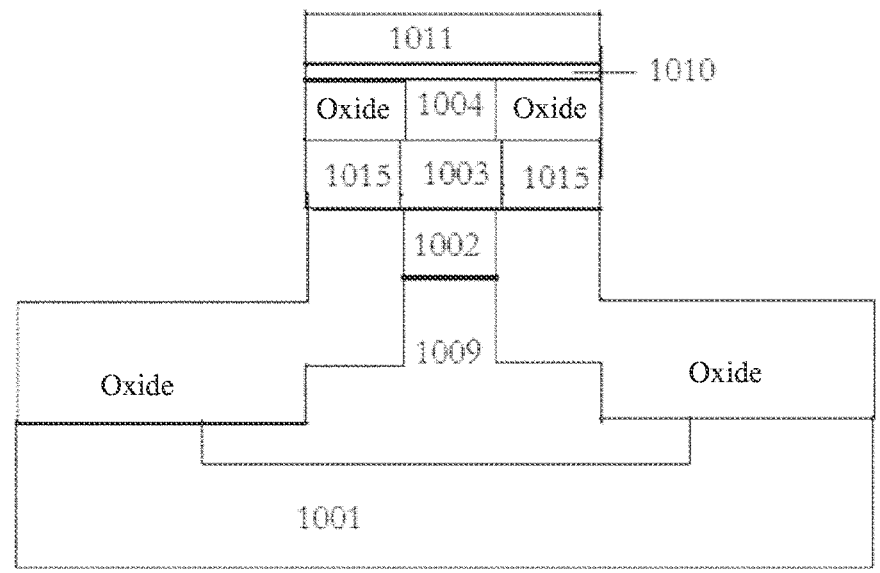
FIG. 11a shows a sixteenth process flowchart of a semiconductor device according to one or more embodiments of the present disclosure.
Figure 11B:
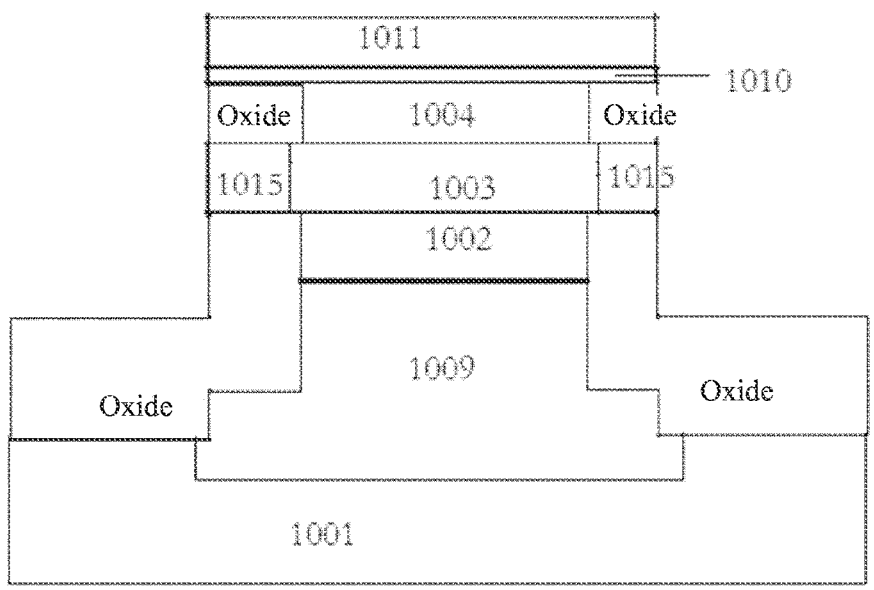
FIG. 11b shows a seventeenth process flowchart of a semiconductor device according to one or more embodiments of the present disclosure.

As shown in FIGS. 11a and 11b (FIG. 11a is a cross-sectional view along the AA' direction, and FIG. 11b is a cross-sectional view along the BB' direction), step S202-4 may be provided to deposit a dielectric layer such as oxide to cover the active region, and the oxide is processed to expose the sacrificial gate 1015 for the protection and etching stop, which is also used to shape a dimension of the gate stack 1005 to be prepared. The dielectric layer and the oxide layer 1010 may be made of a same material or different materials. For convenience, the same reference numeral 1010 as before is used here. The specific process for processing the oxide may be chemical mechanical planarization CMP or chemical etching, which is not limited here.

Figure 12A:
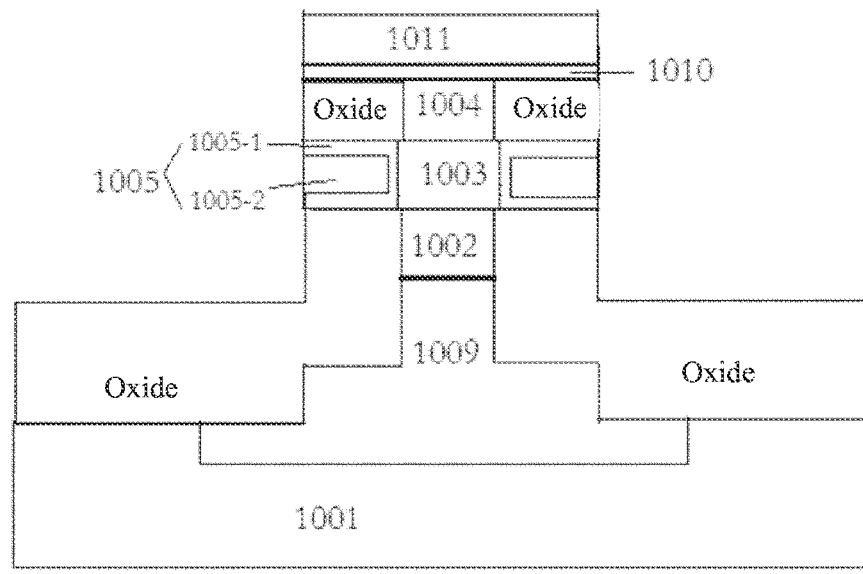
FIG. 12a shows a eighteenth process flowchart of a semiconductor device according to one or more embodiments of the present disclosure.
Figure 12B:
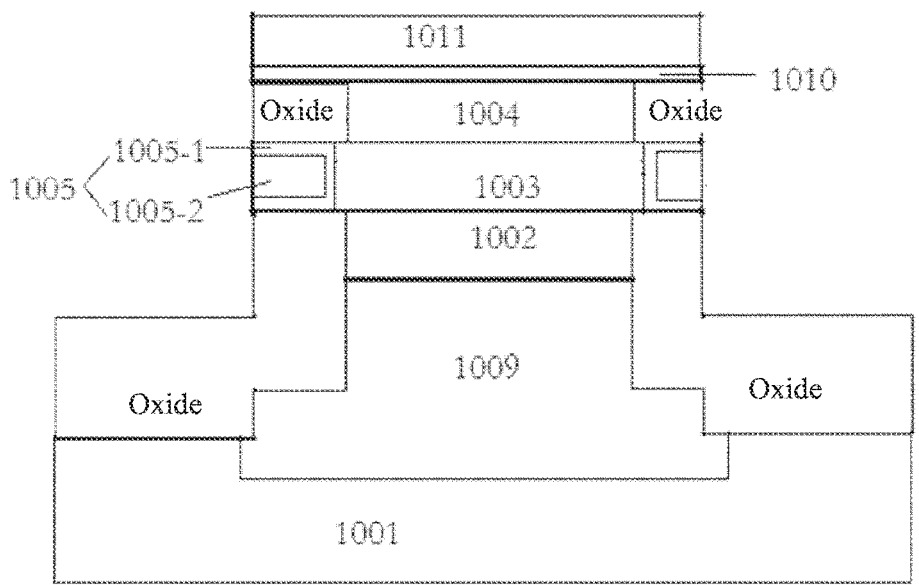
FIG. 12b shows a nineteenth process flowchart of a semiconductor device according to one or more embodiments of the present disclosure.

Next, in a preparation step S202-5, the sacrificial gate 1015 is removed, and the gate stack 1005 is prepared at the outer periphery of the channel layer 1003 relative to the recess (a position of the original sacrificial gate 1015). As shown in FIG. 12a and FIG. 12b (FIG. 12a is a cross-sectional view along the AA' direction, and FIG. 12b is a cross-sectional view along the BB' direction), the gate dielectric layer 1005-1 and the gate conductor layer 1005-2 may be sequentially deposited on the structure shown in FIG. 11a (with the sacrificial gate 1015 removed), and the deposited gate dielectric layer 1005-1 and the gate conductor layer 1005-2 are etched back (for example, RIE) to be located in the recess. In another embodiment of the present disclosure, when the gate stack is etched back, a part of the gate stack may be retained on the sidewalls of the dielectric layer to form an extension of the gate stack structure in a form of sidewall, and the gate conductor layer may form a capacitor structure together with the intermediate dielectric layer 1007 and the second conductive layer 1008.

For example, the gate dielectric layer 1005-1 may include a high-K gate dielectric such as $HfO_2$, and the gate conductor layer 1005-2 may include a metal gate conductor. In addition, a function adjustment layer may also be formed between the gate dielectric layer 1005-1 and the gate conductor layer 1005-2. Before forming the gate dielectric layer 1005-1, an interface layer such as an oxide layer may also be formed, which is not limited here.

So far, the preparation of the active region and the gate stack is completed.

Next, step S203 is performed to sequentially form a first conductive layer 1006, an intermediate dielectric layer 1007, and a second conductive layer 1008 on the outer periphery of the active region and the gate stack 1005. A dimension of the second conductive layer 1008 is determined according to a negative capacitance of the semiconductor device.

Figure 13A:
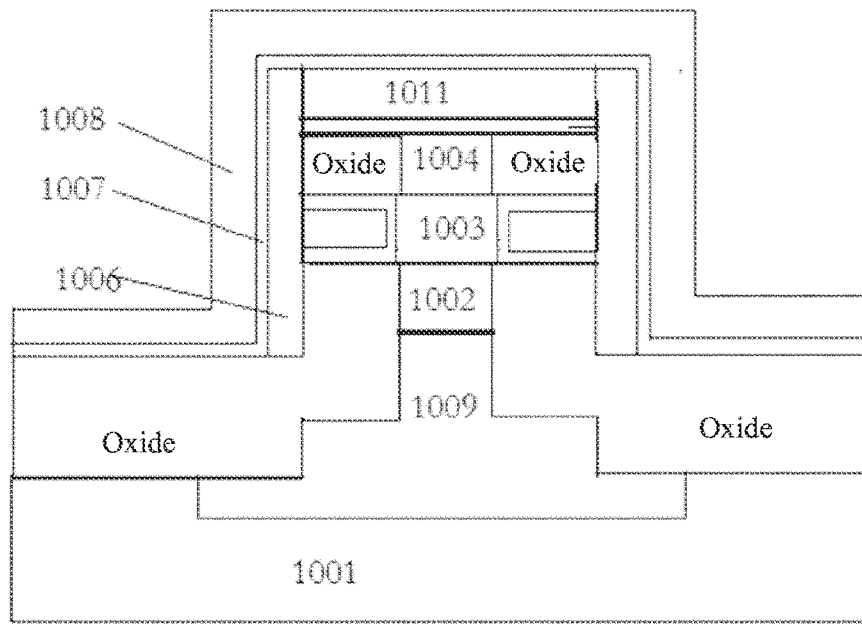
FIG. 13a shows a twentieth process flowchart of a semiconductor device according to one or more embodiments of the present disclosure.
Figure 13B:
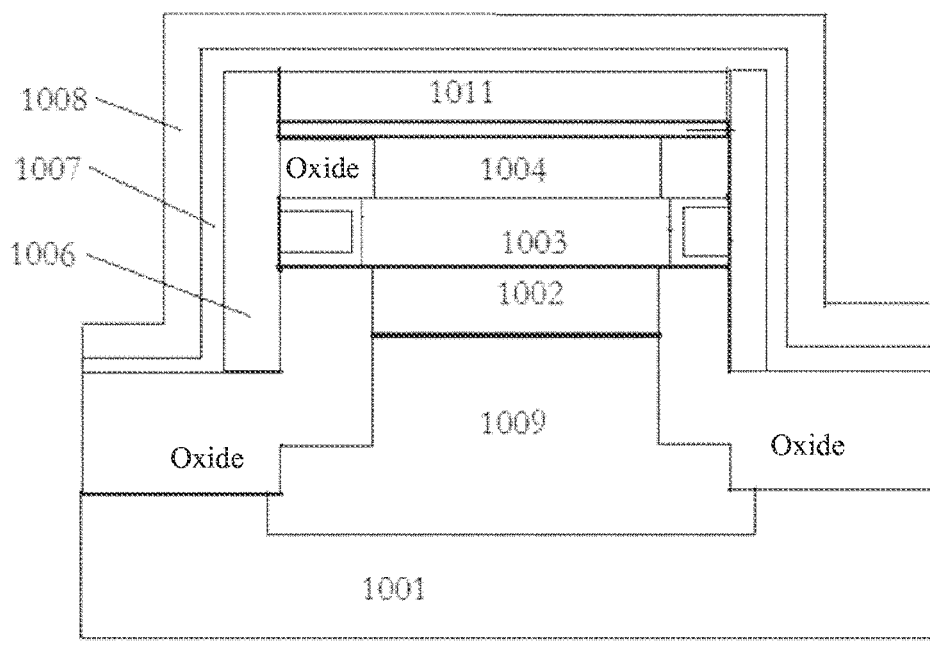
FIG. 13b shows a twenty-first process flowchart of a semiconductor device according to one or more embodiments of the present disclosure.

In some embodiments, as shown in FIG. 13a and FIG. 13b (FIG. 13a is a cross-sectional view along the AA' direction, and FIG. 13b is a cross-sectional view along the BB' direction), the first conductive layer 1006, the intermediate dielectric layer 1007, and the second conductive layer 1008 are sequentially formed on the structure shown in FIG. 12a. In the following, the formation process and method of each layer is introduced in detail.

First, the first conductive layer 1006 is formed around the outer periphery of the side surfaces of the active region and the outer periphery of the side surfaces of the gate stack 1005, the first conductive layer 1006 is electrically connected to gate electrodes of the gate stack 1005, and the first conductive layer 1006 is isolated from the active region. For example, a material of the first conductive layer 1006 is deposited first, and the material may be a metal material or a TiN material, with a thickness of 2 nm to 15 nm. In order to reduce a resistance of the first conductive layer 1006, the first conductive layer 1006 may be a multilayer metal layer, and its deposition process may be chemical vapor deposition CVD or atomic layer deposition ALD, etc. Then, the deposited material of the first conductive layer may be etched (for example, by using RIE etching), to remove a part of the deposited material that covers the top of the active region, and leave a part of the deposited material that surrounds the side surfaces of the active region, so as to form the first conductive layer 1006.

Then, the intermediate dielectric layer 1007 is formed to cover the outer periphery of the first conductive layer 1006 and the top of the active region. The intermediate dielectric layer 1007 surrounds and covers the first conductive layer and isolates the top covering the active region, which is specifically isolated by the protective layer 1011. For example, after forming the first conductive layer 1006, the intermediate dielectric layer 1007 is deposited. A material of the intermediate dielectric layer 1007 may be a ferroelectric material or a negative capacitance material, and may be an oxide containing Hf and Zr, such as $HfZrO_2$, with a thickness of 2 nm to 15 nm. The deposition process may be chemical vapor deposition CVD or atomic layer deposition ALD, etc.

Next, the second conductive layer 1008 is formed around the outer periphery of the side surfaces of the intermediate dielectric layer 1007, and the height or area of the second conductive layer 1008 is determined according to the negative capacitance of the semiconductor device. Specifically, the height or area of the second conductive layer 1008 is determined according to the following condition: $Cis=Cn*Cip/(Cn+Cip)<0$ or $-|Cn|*Cip/(-|Cn|+Cip)<0$, Cn is a negative capacitance of the semiconductor device between the first conductive layer and the second conductive layer, Cip is a positive capacitance of the semiconductor device between the inversion layer in the channel layer and the gate stack, and Cis is a capacitance after Cn and Cip are connected in series. Therefore, by adjusting the height or area of the second conductive layer 1008, the ability to store charges in the floating gate of the memory device or the sub-threshold swing in the logic device may be controlled.

When the device types are different, the materials of the corresponding intermediate dielectric layer and the dimensions of the second conductive layer 1008 are set differently. The following three are listed as examples.

In a first case, the semiconductor device is a logic device.

Correspondingly, the intermediate dielectric layer 1007 includes a negative capacitance material. The height or area of the second conductive layer 1008 is determined according to the following condition: $Cs=Cis*Cc/(Cis+Cc)>=0$ or $-|Cis|*Cc/(-|Cis|+Cc)>=0$, Cc is a positive capacitance between the channel layer and the inversion layer in the channel layer, and Cs is a capacitance after Cis and Cc are connected in series. This condition may improve the sub-threshold swing of the logic device and make the sub-threshold swing steeper.

In a second case, the semiconductor device is a ferroelectric memory device.

Correspondingly, the intermediate dielectric layer 1007 includes a ferroelectric material. The height or area of the second conductive layer 1008 is determined according to the following condition: $Cs=Cis*Cc/(Cis+Cc)<0$ or $-|Cis|*Cc/(-|Cis|+Cc)<0$, Cc is a positive capacitance between the channel layer and the inversion layer in the channel layer, Cs is a capacitance after Cis and Cc are connected in series. This condition may improve the ability of the storage device to store charges in the floating gate.

In a third case, the semiconductor device is a flash memory, and the intermediate dielectric layer includes an insulating dielectric material. The height or area of the second conductive layer is determined according to the reliability, durability and data retention time of the device.

For example, a material of the second conductive layer 1008 may be a metal material or a TiN material, with a thickness of 2 nm to 15 nm. In order to reduce a resistance of the second conductive layer 1008, the second conductive layer 1008 may be a multilayer metal layer, and its deposition process may be chemical vapor deposition CVD or atomic layer deposition ALD, etc.

Preferably, the second conductive layer 1008 may be formed around the outer periphery of the side surfaces of the intermediate dielectric layer 1007, and a contact portion 1008-1 of the second conductive layer 1008 is formed. The contact portion 1008-1 extends from the outer periphery of the side surfaces of the intermediate dielectric layer 1007 to the top surface of the intermediate dielectric layer 1007.

Figure 14A:
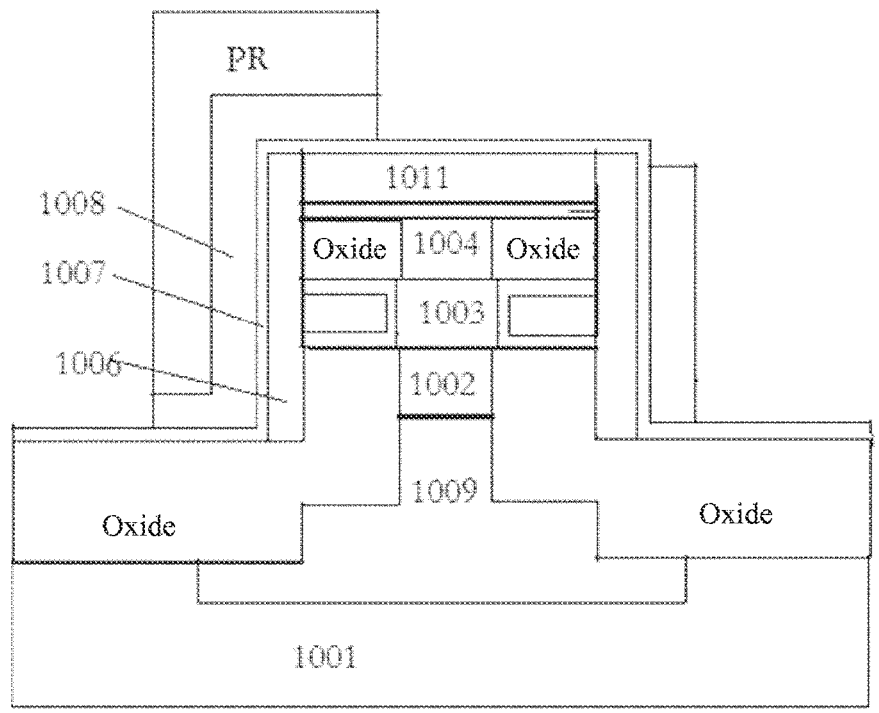
FIG. 14a shows a twenty-second process flowchart of a semiconductor device according to one or more embodiments of the present disclosure.
Figure 14B:
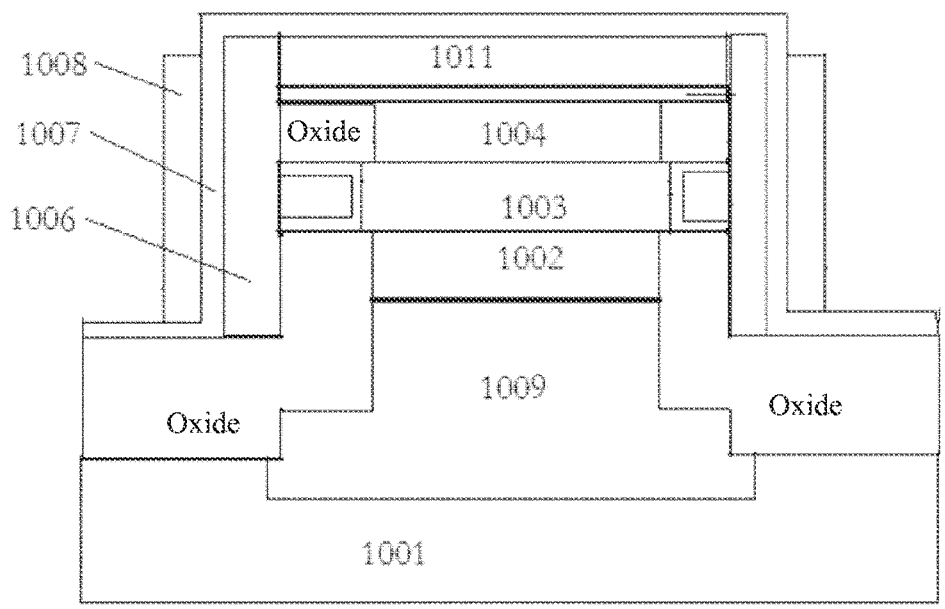
FIG. 14b shows a twenty-third process flowchart of a semiconductor device according to one or more embodiments of the present disclosure.
Figure 14C:
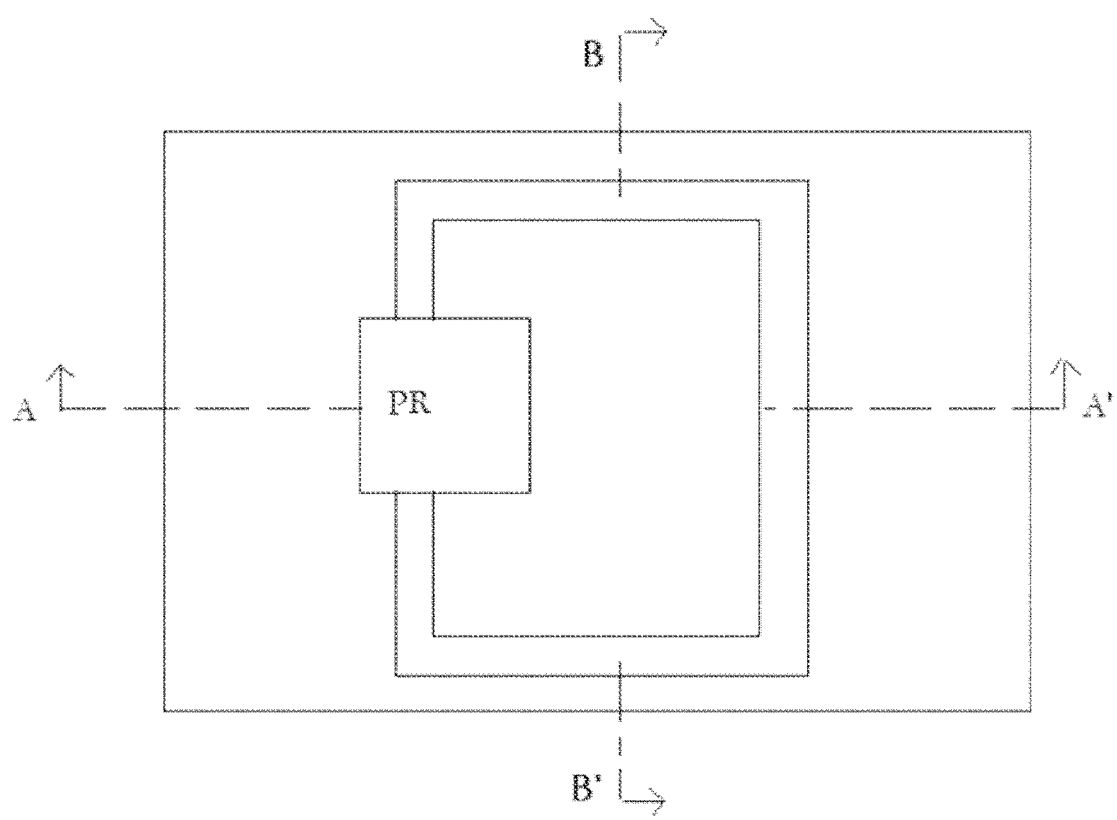
FIG. 14c shows a twenty-fourth process flowchart of a semiconductor device according to one or more embodiments of the present disclosure.

As shown in FIG. 14a, FIG. 14b and FIG. 14c (FIG. 14a is a cross-sectional view taken along a line AA' in FIG. 14c, FIG. 14b is a cross-sectional view taken along a line BB' in FIG. 14c, and FIG. 14c is a corresponding top view), after depositing a material of the second conductive layer to cover the intermediate dielectric layer, a patterned photoresist PR is formed first, and then the material of the second conductive layer is selectively etched. The second conductive layer 1008 is formed around the outer periphery of the side surfaces of the intermediate dielectric layer 1007, and a contact portion 1008-1 is etched on the top surface of the intermediate dielectric layer 1007, and a part of the material of the second conductive layer is removed from the top surface of the intermediate dielectric layer 1007 except the contact portion 1008-1.

Next, as shown in FIG. 1a and FIG. 1b (FIG. 1a is a cross-sectional view, FIG. 1b is a corresponding top view, and FIG. 1a is a cross-sectional view taken along a line AA' in FIG. 1b), after the first conductive layer 1006, the intermediate dielectric layer 1007, and the second conductive layer 1008 are formed, an oxide is filled to cover the second conductive layer 1008 and the intermediate dielectric layer 1007, and then a gate contact through hole, a first source and drain contact through hole, and a second source and drain contact through hole are opened on the oxide surface. The through holes described above are filled with a conductive material to form a gate contact portion 1012 electrically connected to the second conductive layer 1008, a first source and drain contact portion 1013 electrically connected to the first source and drain layer 1002, and a second source and drain contact portion 1014 electrically connected to the second source and drain layer 1004. Each contact portion may be made of metal or other conductive materials. The first source and drain contact portion 1013 may be directly connected to the contact layer 1009 to realize the electrical connection with the first source and drain layer 1002, or the first source and drain contact portion 1013 may be directly connected to the first source and drain layer 1002. Other contact portions and areas needed to be electrically connected may also be directly connected or connected through other conductors, which is not limited here.

In another aspect, the present disclosure also provides an integrated circuit including the aforementioned semiconductor device, as detailed below.

The present disclosure provides an integrated circuit including the aforementioned semiconductor device. The integrated circuit may include one or more of the aforementioned semiconductor devices, and may also include other devices, which is not limited here.

In another aspect, the present disclosure further provides an electronic apparatus including the aforementioned semiconductor device, as detailed below.

The present disclosure provides an electronic apparatus including the aforementioned semiconductor device and/or the aforementioned integrated circuit.

The electronic apparatus may be: a smart phone, a computer, a tablet computer, artificial intelligence, a wearable device, or a mobile power supply, etc., which is not limited here.

The above-mentioned technical solutions in the embodiments of the present disclosure have at least the following technical effects or advantages.

According to the embodiments of the present disclosure, a semiconductor device, a method for manufacturing the semiconductor device, an integrated circuit, and an electronic apparatus are provided, a structure including the first conductive layer, the intermediate dielectric layer and the second conductive layer is provided outside the gate stack, the negative capacitance of the semiconductor device may be effectively adjusted by providing the dimension of the second conductive layer, so as to improve the performance of the device. Further, the outer periphery of the channel layer is arranged to protrude outwardly relative to the outer periphery of the first source and drain layer and the outer periphery of the second source and drain layer, so as to reduce an over-capacitance between the source/drain and the gate and improve the performance of the device.

In the above description, the technical details such as patterning and etching of each layer have not been described in detail. However, those skilled in the art should understand that various technical means may be used to form layers, regions, etc., of a desired shape. In addition, in order to form the same structure, those skilled in the art may also design a method that is not completely the same as the method described above. In addition, although the respective embodiments are described above, this does not mean that the measures in the respective embodiments cannot be advantageously used in combination.

Obviously, those skilled in the art may make various changes and modifications to the present disclosure without departing from the spirit and scope of the present disclosure. In this way, if these modifications and variations of the present disclosure fall within the scope of the claims of the present disclosure and their equivalent technologies, the present disclosure is also intended to cover these modifications and variations.

What is claimed is:

1. A semiconductor device, comprising:
    a substrate;
    an active region on the substrate, wherein the active region comprises a first source and drain layer, a channel layer, and a second source and drain layer sequentially stacked on the substrate;
    a gate stack formed around an outer periphery of the channel layer, wherein the gate stack is self-aligned with the channel layer, and wherein the gate stack comprises a gate dielectric layer and a gate conductor layer; and
    an intermediate dielectric layer and a second conductive layer around an outer periphery of the gate stack and an outer periphery of the active region,
    wherein the gate conductor layer is completely insulated from the first source and drain layer and from the second source and drain layer.

2. The semiconductor device according to claim 1, wherein a first conductive layer is further provided between the gate stack and the intermediate dielectric layer.

3. The semiconductor device according to claim 2, wherein the first conductive layer surrounds an outer periphery of side surfaces of the active region and an outer periphery of side surfaces of the gate stack, the first conductive layer is electrically connected to a gate electrode of the gate stack, and the first conductive layer is isolated from the active region.

4. The semiconductor device according to claim 3, wherein the first conductive layer and the gate electrode of the gate stack form a floating gate.

5. The semiconductor device according to claim 4, wherein a dimension of the second conductive layer is used to determine a maximum value of a number of charges stored in the floating gate.

6. The semiconductor device according to claim 2, wherein the intermediate dielectric layer surrounds and covers the first conductive layer, and isolates a top covering the active region.

7. The semiconductor device according to claim 2, wherein a material of the first conductive layer is at least the same as one of metal materials constituting the gate stack.

8. The semiconductor device according to claim 1, wherein the intermediate dielectric layer comprises a negative capacitance dielectric material or a ferroelectric material.

9. The semiconductor device according to claim 1, wherein a dimension of the second conductive layer is used to determine a value of a negative capacitance between the gate conductor layer and the second conductive layer.

10. The semiconductor device according to claim 1, wherein the second conductive layer surrounds an outer periphery of side surfaces of the intermediate dielectric layer, and a height or an area of the second conductive layer is determined according to a positive capacitance of the semiconductor device.

11. The semiconductor device according to claim 10, wherein the height or area of the second conductive layer is determined according to the following condition: $Cis=Cn*Cip/(Cn+Cip)<0$ or $-|Cn|*Cip/(-|Cn|+Cip)<0$, wherein Cn is a negative capacitance between the gate conductor layer and the second conductive layer, Cip is a positive capacitance between an inversion layer in the channel layer and the gate stack, and Cis is a capacitance after Cn and Cip are connected in series.

12. The semiconductor device according to claim 11, wherein the semiconductor device is a logic device, and the intermediate dielectric layer comprises a negative capacitance dielectric material,
    wherein the height or area of the second conductive layer also meets the following condition: $Cs=Cis*Cc/(Cis+Cc)>=0$ or $-|Cis|*Cc/(-|Cis|+Cc)>=0$, wherein Cc is a positive capacitance between the channel layer and the inversion layer in the channel layer, Cs is a capacitance after Cis and Cc are connected in series.

13. The semiconductor device according to claim 11, wherein the semiconductor device is a ferroelectric memory device, and the intermediate dielectric layer comprises a ferroelectric material,
    wherein the height or area of the second conductive layer also meets the following condition: $Cs=Cis*Cc/(Cis+Cc)<0$ or $-|Cis|*Cc/(-|Cis|+Cc)<0$, wherein Cc is a positive capacitance between the channel layer and the inversion layer in the channel layer, Cs is a capacitance after Cis and Cc are connected in series.

14. The semiconductor device according to claim 1, wherein the semiconductor device is a flash memory device.

15. The semiconductor device according to claim 14, wherein a height or an area of the second conductive layer is determined according to reliability, durability, or a data retention time of the semiconductor device.

16. The semiconductor device according to claim 1, wherein the second conductive layer further comprises a contact portion extending from an outer periphery of side surfaces of the intermediate dielectric layer to a top of the intermediate dielectric layer.

17. The semiconductor device according to claim 1, wherein the outer periphery of the channel layer protrudes outwardly with respect to an outer periphery of the first source and drain layer and an outer periphery of the second source and drain layer.

18. The semiconductor device according to claim 1, wherein:
if the semiconductor device is a P-type device, each of the first source and drain layer and the second source and drain layer is P-type doped;
if the semiconductor device is an N-type device, each of the first source and drain layer and the second source and drain layer is N-type doped; and
if the semiconductor device is a tunneling field effect transistor, the first source and drain layer and the second source and drain layer are doped of opposite types.

19. The semiconductor device according to claim 1, further comprising:
an epitaxial layer between the first source and drain layer and the substrate.

20. The semiconductor device according to claim 1, further comprising:
a dielectric layer covering side surfaces of the active region and a top of the active region, wherein dielectric layer is configured to isolate the active region from the first conductive layer, and isolate the active region from the intermediate dielectric layer.

21. The semiconductor device according to claim 1, further comprising: a dielectric layer covering side surfaces of the active region and a top of the active region, wherein the first gate stack extends to outer sidewalls of the dielectric layer.

22. The semiconductor device according to claim 21, further comprising:
a protective layer between the dielectric layer on the active region and the intermediate dielectric layer.

23. The semiconductor device according to claim 1, further comprising:
a gate contact portion electrically connected to the second conductive layer;
a first source and drain contact portion electrically connected to the first source and drain layer; and
a second source and drain contact portion electrically connected to the second source and drain layer.

24. An integrated circuit comprising the semiconductor device according to claim 1.

25. An electronic apparatus comprising an integrated circuit formed by the semiconductor device according to claim 1.

26. The electronic apparatus according to claim 25, which is specifically: a smart phone, a computer, a tablet computer, artificial intelligence, a wearable device, or a mobile power supply.

27. A method for manufacturing a semiconductor device, comprising:
forming a first source and drain layer, a channel layer, and a second source and drain layer on a substrate sequentially;
defining an active region of a semiconductor device in the first source and drain layer, the channel layer, and the second source and drain layer, and forming a gate stack around an outer periphery of the channel layer, wherein the gate stack is self-aligned with the channel layer, and wherein the gate stack comprises a gate dielectric layer and a gate conductor layer; and
forming an intermediate dielectric layer and a second conductive layer sequentially around an outer periphery of the active region and an outer periphery of the gate stack
wherein the gate conductor layer is completely insulated from the first source and drain layer and from the second source and drain layer.

28. The method according to claim 27, wherein before forming the intermediate dielectric layer, the method further comprises: forming a first conductive layer.

29. The method according to claim 28, wherein the forming the first conductive layer, the intermediate dielectric layer, and the second conductive layer comprises:
forming a first conductive layer around an outer periphery of side surfaces of the active region and an outer periphery of side surfaces of the gate stack, wherein the first conductive layer is electrically connected to a gate electrode of the gate stack, and the first conductive layer is isolated from the active region;
forming an intermediate dielectric layer to cover an outer periphery of the first conductive layer and a top of the active region;
forming a second conductive layer around an outer periphery of side surfaces of the intermediate dielectric layer, wherein a dimension of the second conductive layer is used to determine a value of a negative capacitance between the gate conductor layer and the second conductive layer; and
etching the second conductive layer to expose at least a part of a top of the intermediate dielectric layer.

30. The method according to claim 27, wherein a value of a negative capacitance between the gate conductor layer and the second conductive layer is determined by a dimension of the second conductive layer.

31. The method according to claim 27, wherein the defining an active region of a semiconductor device in the first source and drain layer, the channel layer, and the second source and drain layer, and forming a gate stack around an outer periphery of the channel layer comprises:
etching the channel layer so that the outer periphery of the channel layer is recessed inwardly with respect to an outer periphery of the first source and drain layer and an outer periphery of the second source and drain layer.

32. The method according to claim 27, wherein the defining an active region of a semiconductor device in the first source and drain layer, the channel layer, and the second source and drain layer, and forming a gate stack around an outer periphery of the channel layer comprises:
selectively etching the first source and drain layer, the channel layer and the second source and drain layer sequentially, to form a columnar shape;
selectively etching the channel layer so that an outer periphery of the channel layer is recessed inwardly with respect to an outer periphery of the first source and drain layer and an outer periphery of the second source and drain layer;

forming a sacrificial gate in a recess around the outer periphery of the channel layer, wherein the outer periphery of the channel layer is recessed inwardly with respect to the outer periphery of the first source and drain layer and the outer periphery of the second source and drain layer;

selectively etching the first source and drain layer and the second source and drain layer so that the outer periphery of the first source and drain layer and the outer periphery of the second source and drain layer are recessed inwardly with respect to an outer periphery of the sacrificial gate;

filling a dielectric layer around an outer periphery of side surfaces of the active region to cover the active region;

removing the sacrificial gate to form an opening; and forming the gate stack in the opening.

33. The method according to claim 32, the forming the gate stack in the opening comprises:

depositing the gate dielectric layer and a gate electrode layer in the opening, wherein the gate dielectric layer and the gate electrode layer extend to an outer sidewall of the dielectric layer; and etching the gate dielectric layer and the gate electrode layer so that a part of the gate stack formed extends to an outer sidewall of the dielectric layer.

34. The method according to claim 26, wherein a height or an area of the second conductive layer is determined according to the following condition: $Cis=Cn*Cip/(Cn+Cip)<0$ or $-|Cn|*Cip/(-|Cn|+Cip)<0$, Cn is a negative capacitance between the gate conductor layer and the second conductive layer, Cip is a positive capacitance between an inversion layer in the channel layer and the gate stack, and Cis is a capacitance after Cn and Cip are connected in series.

35. The method according to claim 34, wherein the semiconductor device is a logic device, and the intermediate dielectric layer comprises a negative capacitance dielectric material, wherein the height or area of the second conductive layer further meets: $Cs=Cis*Cc/(Cis+Cc)>=0$ or $-|Cis|*Cc/(-|Cis|+Cc)>=0$, Cc is a positive capacitance between the channel layer and the inversion layer in the channel layer, Cs is a capacitance after Cis and Cc are connected in series.

36. The method according to claim 34, wherein the semiconductor device is a memory device, and the intermediate dielectric layer comprises a ferroelectric material or an insulating dielectric material, wherein the height or area of the second conductive layer further meets: $Cs=Cis*Cc/(Cis+Cc)<0$ or $-|Cis|*Cc/(-|Cis|+Cc)<0$, Cc is a positive capacitance between the channel layer and an inversion layer in the channel layer, Cs is a capacitance after Cis and Cc are connected in series.

37. The method according to claim 27, wherein the semiconductor device is a flash memory.

* * * * *